US012343976B2

(12) United States Patent
Hubert et al.

(10) Patent No.: US 12,343,976 B2
(45) Date of Patent: Jul. 1, 2025

(54) SPANDREL

(71) Applicants: AGC GLASS EUROPE, Louvain-la-Neuve (BE); AGC Inc., Tokyo (JP); AGC FLAT GLASS NORTH AMERICA, INC., Alpharetta, GA (US); AGC VIDROS DO BRASIL LTDA, Sao Paulo (BR)

(72) Inventors: Julie Hubert, Brussels (BE); Stijn Mahieu, Lovendegem (BE); Daphné Stassen, Saint-Servais (BE); Xavier Sahyoun, Brussels (BE)

(73) Assignees: AGC GLASS EUROPE, Louvain-la-neuve (BE); AGC Inc., Tokyo (JP); AGC FLAT GLASS NORTH AMERICA, INC., Alpharetta, GA (US); AGC VIDROS DO BRASIL LTDA, Sao Paulo (BR)

( * ) Notice: Subject to any disclaimer, the term of this patent is extended or adjusted under 35 U.S.C. 154(b) by 131 days.

(21) Appl. No.: 17/758,784

(22) PCT Filed: Jan. 11, 2021

(86) PCT No.: PCT/EP2021/050349
§ 371 (c)(1),
(2) Date: Jul. 13, 2022

(87) PCT Pub. No.: WO2021/144213
PCT Pub. Date: Jul. 22, 2021

(65) Prior Publication Data
US 2023/0056622 A1    Feb. 23, 2023

(30) Foreign Application Priority Data

Jan. 16, 2020 (BE) .................................. 2020/0008

(51) Int. Cl.
| | | |
|---|---|---|
| *B32B 7/023* | (2019.01) | |
| *B32B 17/10* | (2006.01) | |
| *B32B 33/00* | (2006.01) | |

(52) U.S. Cl.
CPC .............. *B32B 7/023* (2019.01); *B32B 17/10* (2013.01); *B32B 33/00* (2013.01);
(Continued)

(58) Field of Classification Search
CPC ......... B32B 7/023; B32B 17/10; B32B 33/00; B32B 2250/03; B32B 2255/20;
(Continued)

(56) References Cited

U.S. PATENT DOCUMENTS

| | | | |
|---|---|---|---|
| 2003/0031842 A1* | 2/2003 | Marietti ............ | B32B 17/10339 428/432 |
| 2007/0026241 A1 | 2/2007 | Kriltz et al. | |

(Continued)

FOREIGN PATENT DOCUMENTS

| | | |
|---|---|---|
| EP | 2 517 877 A2 | 10/2012 |
| GB | 2 311 791 A | 10/1997 |

OTHER PUBLICATIONS

International Search Report mailed Feb. 25, 2021 in PCT/EP2021/050349 filed on Jan. 11, 2021, 2 pages.

*Primary Examiner* — Zachary M Davis
(74) *Attorney, Agent, or Firm* — Oblon, McClelland, Maier & Neustadt, L.L.P.

(57) ABSTRACT

A spandrel including a first substrate, an intermediate film made of polymer material, and a second, opaque substrate, such that the first substrate is coated with at most two layers which are deposited on the surface located on the side facing the intermediate film made of polymer material and which include at least one upper dielectric layer.

22 Claims, 5 Drawing Sheets

(52) U.S. Cl.
CPC ....... *B32B 2250/03* (2013.01); *B32B 2255/20* (2013.01); *B32B 2255/28* (2013.01); *B32B 2305/34* (2013.01); *B32B 2307/204* (2013.01); *B32B 2307/402* (2013.01); *B32B 2307/416* (2013.01); *B32B 2307/418* (2013.01); *B32B 2311/16* (2013.01); *B32B 2311/20* (2013.01); *B32B 2419/00* (2013.01)

(58) Field of Classification Search
CPC ............ B32B 2255/28; B32B 2305/34; B32B 2307/204; B32B 2307/402; B32B 2307/416; B32B 2307/418; B32B 2311/16; B32B 2311/20; B32B 2419/00; B32B 17/10005; B32B 17/20036; B32B 17/10119; B32B 17/10174; B32B 17/10201; B32B 17/10211; B32B 17/10339; B32B 17/10651
See application file for complete search history.

(56) References Cited

U.S. PATENT DOCUMENTS

2013/0022821 A1    1/2013  Kriltz et al.
2021/0340061 A1*  11/2021  Wanakule ......... B32B 17/10229

* cited by examiner

SPANDREL

TECHNICAL FIELD

The present invention relates to spandrel panels incorporating at least one glazed panel and which are intended to be placed in areas of a facade that are not to transmit light. Their role is therefore to conceal certain parts of this facade, between the parts occupied by windows. More particularly, this invention discloses spandrel panels that harmonize with the adjacent transparent glazings, ensuring a good esthetic. The spandrel panels of the invention are assemblies of at least two substrates, one of which is transparent and the other of which is opaque. The exterior substrate (La exterior relative to the building) transmits light well, this meaning that the spandrel panel of the invention lends itself well to insertion of photovoltaic cells therein. Such spandrel panels are therefore intended to be used, in a facade, to form so-called building-integrated photovoltaics (BIPV).

SOLUTIONS OF THE PRIOR ART

In many modern constructions, glazed walls comprise transparent areas and non-transparent areas. The windows themselves may be relatively transparent or relatively reflective depending on the nature of the coatings borne by the glass. These coatings, which are almost indispensable, confer advantageous thermal properties on a glazing, such as, for example, solar-control and low-emissivity properties. Suitably choosing the materials and/or their thickness allows a pleasant color in reflection and/or in transmission to be achieved, such as a blue, green, bronze or neutral tint for example, these tints generally being the preferred ones. Other properties that the glazing may be required to have are, for example, a self-cleaning character, an anti-fogging character, or any other property requested by the customer or required by the circumstances.

According to another aspect, and for various reasons, glazings intended for such buildings must be heat treated, in particular for safety reasons, this implying that they must be subjected to temperatures exceeding 500° C., or even exceeding 600° C., for several minutes and according to methods well known in the art. This implies that any coatings borne by the glass must be capable of undergoing this treatment without being degraded, i.e. their optical and energy properties must not be modified, or not much, by the heat treatment.

Spandrel panels are either intrinsically opaque or are made opaque by various covering or coating systems. However, even though spandrel panels are opaque to visible light, they must be in harmony with the hue in reflection of the adjacent windows. The whole of the glazed facade must appear optically uniform from the exterior, whatever the viewing angle, both in respect of reflection of light and in respect of the shade of its hue.

A number of ways of providing a suitable spandrel panel are known in the art. For a long time it has been known how to opacify a glass substrate with a colored enamel. In is particular, U.S. Pat. No. 3,951,525 suggests depositing an opaque enamel on a reflective metal oxide, the metal oxide being the same as the one used for the windows of the facade. The problem with this solution is that the harmonization is sub-optimal and moreover not stable over time.

WO2004092522A1 suggests spandrel panels taking the form of double glazings the interior glass of which (i.e. the glass building-side) has a very low light transmittance (lower than 15%) to prevent people looking in, and the exterior glass of which is coated with a solar-control stack. Such a construction is expensive and does not fully meet the esthetic requirements of modern glass facades.

Opacifying metal layers have also been suggested, as for example in EP0441011 or EP3172175. These metal layers are generally included in more complex stacks. The above two documents notably suggest particular relationships between refractive indices and absorption coefficients. The stack also requires dielectrics to be present, to adjust the optical properties.

EP2517877 discloses a laminated glazing the exterior substrate of which is made opaque by means of an absorbent stack that makes contact with the PVB used as an adhesive between the two substrates. The essential feature of that invention is that the glass coated with the opacifying stack is an extra-clear glass that contains little iron and that therefore itself has a very low absorption. This feature has, according to the inventor, the advantage of making it possible to avoid a severe heat treatment. However, said patent is silent as to the aspect of harmonization of hue with the windows and, in addition, this kind of solution inevitably leads to problems with storage cost.

In conclusion, enamels and paints are limited and costly solutions (additional heating step) and do not always meet esthetic requirements. The visual appearance of a panel simply colored by enamel or paint does not meet current requirements. None of the prior-art solutions allow the glass panel to be heat treated. Sometimes the solution is unacceptable for inventory-management reasons. Often the requirements in respect of hue harmonization are not met.

In addition, apart from these questions of esthetics, cost and durability, new challenges are arising as a result of current environmental issues. Buildings are increasingly equipped with photovoltaic cells to collect energy from the sun and to convert it into electricity. Although the first photovoltaic cells were mainly installed on roofs, there is now a growing demand for solutions that would allow them to be installed on facades. A first solution consists in installing the photovoltaic cells in windows, ways then needing to be found of hiding them from sight or of making them esthetically acceptable. Another possibility is to hide them in spandrel panels, but this obviously requires measures to be taken to allow light to reach the photovoltaic cells without too great a loss of efficiency, while not adversely affecting the esthetics of the ensemble.

Today's architects want a turnkey solution that meets requirements in respect of esthetics (color, reflection, harmony) and thermal performance. No prior-art solution is a turnkey solution providing a spandrel panel that is of acceptable manufacturing cost, that meets esthetic requirements, and that in addition allows photovoltaic cells to be incorporated. This is precisely what the present invention is proposing, and in addition it has a good chemical resistance and mechanical strength.

OBJECTIVES OF THE INVENTION

The inventors have discovered that a spandrel panel may advantageously be formed by laminating a first substrate and a second substrate by means of an intermediate sheet of polymeric material provided for adhesion purposes. Throughout this text, the first substrate is the substrate furthest from the building and therefore the exterior-most substrate.

The first substrate is covered with a top dielectric layer that is characterized by, on the one hand, a sufficiently high refractive index and, on the other hand, a sufficiently low absorption coefficient. These features allow an exterior reflection of pleasant hue and a good light transmission to be achieved. The hue in exterior reflection may be adjusted through suitable choice of the thickness of the layer and/or its nature. Suitably choosing the nature of the materials allows requirements in respect of resistance to heat treatments and of durability to be met.

The first substrate is joined to a second substrate by means of an intermediate polymeric material, to form a laminate. The top dielectric layer is deposited on the first is substrate on the face that will be oriented toward the intermediate polymeric material (i.e. in position P2).

According to a first embodiment, the top dielectric layer makes direct contact with the first substrate.

According to a second embodiment, the first substrate of the invention is covered with an underlayer placed between the first substrate and the top dielectric layer. The underlayer is a barrier layer the role of which is to protect the layer of the invention when its nature does not provide sufficient resistance to heat treatments.

In each embodiment, the second substrate is opaque.

Preferably, the top dielectric layer and the underlayer are the only layers deposited on the first substrate.

In one particular embodiment of the invention, photovoltaic cells are placed between the two substrates of the laminate according to either of the above embodiments.

BRIEF DESCRIPTION OF THE DRAWINGS

To facilitate comprehension thereof, the figures presented below have not been drawn to scale.

DESCRIPTION OF THE INVENTION

Figure 1:
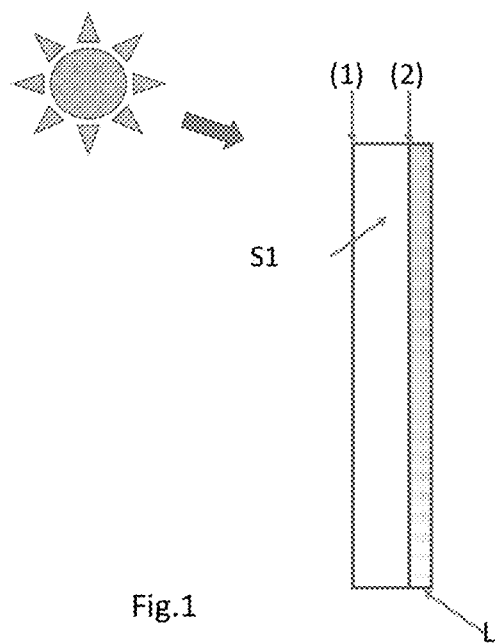
FIG. 1. Cross section of a first substrate intended for the first embodiment.

The invention relates to a laminated assembly (laminate) comprising a first substrate and a second substrate that are held together by means of an intermediate sheet of polymeric material that extends over at least one area of each of the two substrates.

The first substrate is the exterior substrate, i.e. the substrate farthest from the building. Preferably, it is a glass substrate. By glass, what is meant is transparent mineral glass made mainly of silica, such especially including ordinary soda-lime float glass, the thickness of which is comprised between 0.5 and 20 mm, preferably between 1.5 and 10 mm and more preferably between 2 and 6 mm. Advantageously, this first substrate may be made of dearer or even extra-clear soda-lime glass, this meaning that it is characterized by a low total iron content expressed in $Fe_2O_3$, and in particular by a total iron content expressed in $Fe_2O_3$ that is at most 0.015 wt % in the case of extra-clear glass and at most 0.1 wt % in the case of clear glass. The consequence of such a low iron content is that the energy transmittance of the glass is much better, and especially above 90% for extra-clear glass versus 82% for normal float glass the thickness of which is 5 mm. The advantage of an improved energy transmittance is that a better efficiency is obtained when photovoltaic cells are placed behind such glass.

Light reflectance and transmittance are given in accordance with standard EN 410 (2011). They are measured using a source according to standard illuminant D65, as specified by the International Commission on Illumination (CIE), at a solid angle of 2°.

Exterior reflectance, i.e. the reflectance on the side of the uncoated face of the glass, is denoted $R_g$ for a monolithic pane of glass, i.e. a non-laminated pane of glass, and $R_{ext}$ in the case of the laminate.

Color parameters are obtained from coordinates in the CIELAB color space. By $a^*_{Rg}$ and $b^*_{Rg}$ what is meant are the color parameters $a^*$ and $b^*$ measured in exterior reflection from a monolithic substrate (i.e. measured on the coating-free side of the glass). $Y_{Rg}$ and $L_{Rg}^*$ are reflectance expressed in percent and luminous intensity (lightness) expressed in percent as measured on the uncoated side of the glass, respectively. The corresponding color parameters measured on the exterior side of the laminate, i.e. on the uncoated side of the first substrate, are denoted $R_{ext}$, $a^*_{ext}$ and $b^*_{ext}$.

Reflectance coating-side for a monolithic pane of glass is denoted $R_c$. The corresponding color parameters are obtained from coordinates in the CIELAB color space. By $a^*_{Rc}$ and $b^*_{Rc}$ what is meant are the color parameters $a^*$ and $b^*$ measured in reflection coating-side on a monolithic substrate. $Y_{Rc}$ and $L_{Rc}^*$ mean reflectance expressed in percent and luminous intensity (lightness) expressed in percent as measured on the coated side of the glass.

Light transmittance in the visible spectrum is according to standard EN 410 (2011). It is denoted Tv and the corresponding color parameters are given by $a^*_{Tv}$ and $b^*_{Tv}$.

Energy transmittance (TE) corresponds to the transmission of a larger portion of the sun's spectrum than the transmission of visible light. This information is particularly important when it is transmitted light energy liable to interact with photovoltaic cells that is of interest. In the present description, energy transmittance is measured according to standard EN 410 (2011) for light of wavelength comprised between 300 and 2500 nm. The simulations of energy transmittance were for their part carried out for light of wavelength comprised between 390 and 2500 nm.

The composition of mixed oxides or nitrides is indicated by ratios that represent the weight percentages of the two constituents of the dielectric, the first number relating to the first element in question. Thus, TZO 65/35 means a mixed titanium-zirconium oxide composed of 65 wt % titanium oxide and of 35 wt % zirconium oxide. Similarly, SiZrN 60/40 means a mixed nitride composed of 60 wt % silicon nitride and of 40 wt % zirconium nitride. The mixed oxide ZSO5 52/48 corresponds to a mixed zinc-tin oxide composed of 52 wt % zinc oxide and of 48 wt % tin oxide, i.e. ZSO5 is zinc stannate ($Zn_2SnO_4$).

The top dielectric layer is characterized by a high refractive index and a low absorption coefficient. Preferably the refractive index of the top dielectric layer is at least 2.0, and preferably at least 2.1. Advantageously, the absorption coefficient of the dielectric layer is at most 0.1 and preferably at most 0.05. The refractive index has an impact on esthetic appearance (color in reflection) whereas the low absorption coefficient allows a higher energy transmittance.

Advantageously, the top dielectric layer is chosen from mixed oxides, nitrides or oxynitrides, i.e. oxides, nitrides or oxynitrides that are mixed in that they comprise at least two different oxides, at least two different nitrides, at least two different oxynitrides (or at least one oxide and one nitride of two different elements). In the case of nitrides, it is in particular possible for partial oxidation to lead to the formation of a mixed oxynitride.

Preferably, the oxides or nitrides from which the dielectric layer of the invention is composed are chosen from the oxides, nitrides or oxynitrides of elements chosen from silicon, titanium, zinc, tin, zirconium, aluminum and niobium, such as for example mixed titanium-zirconium oxide (TZO) or mixed silicon-zirconium nitride (SiZrN).

In all cases, each oxide, nitride or oxynitride forming part of the composition of the top layer is present in a proportion that is no lower than 20% by weight, preferably no lower than 25 wt % and even more preferably no lower than 30% by weight. More particularly, when the dielectric layer is zirconium-titanium oxide, the weight percentage of the titanium oxide is comprised between 62 and 68 wt %. This choice in respect of the mixed oxides, nitrides or oxynitrides makes it possible to advantageously combine the optical properties of one of the oxides, nitrides or oxynitrides of the mixture with the durability properties of another oxide, nitride or oxynitride of the mixture.

The optical thickness of the top dielectric layer and its composition are chosen depending on the desired hue in reflection. This thickness is advantageously at least 40 nm, and preferably at least 50 nm.

Advantageously, this optical thickness is at most 110 nm, preferably at most 80 nm and even more preferably at most 70 nm.

In the laminate, the coating is located on the interior part of the exterior substrate, i.e. on the side of the sheet of polymeric material. Those skilled in the art usually call this face position 2, the faces of the glass sheets of a glazing placed in a building being numbered from the exterior to the interior.

According to the second embodiment of the invention, an underlayer is deposited on the first substrate between said substrate and the top dielectric layer. The role of the underlayer is to protect the top dielectric layer and it may be any oxide, nitride or oxynitride able to play this role. By way of example, mention may be made of the oxides of one or more elements chosen from silicon, tin, zinc, titanium, aluminum, niobium, and zirconium. Advantageously, the nature and thickness of this barrier layer are chosen so that it does not modify the optical characteristics given to the first substrate by the top dielectric layer. More particularly, a layer of mixed zinc-tin oxide (ZSO), and more particularly of zinc stannate, is well suited to playing this barrier-layer role. Advantageously, the geometric thickness of the underlayer is at least equal to 5 nm, and preferably at least equal to 10 nm, and smaller than or equal to 25 nm, and preferably smaller than or equal to 20 nm.

In each embodiment, the underlayer and the top dielectric layer may be applied using a cathode sputtering technique (sputtering being a type of PVD) under conventional conditions that it is well known to use in the art with this type of technique. Using metal targets, nitrides are deposited in a reactive atmosphere of nitrogen and argon and oxides are deposited in a reactive atmosphere of oxygen and argon. As a variant, the dielectric layers are applied using the well-known technique known as PECVD (plasma-enhanced chemical vapor deposition).

Advantageously, the coated first substrate has a glass-side light reflectance ($R_g$) and a glass-side hue in reflection characterized by the values given in table 1. The values in table 1 are for a monolithic pane of glass after tempering.

TABLE 1

| Parameters | Preferred values | Most preferred values |
| --- | --- | --- |
| $Y_{Rg}$ (%) | 18 to 30 | 21 to 27 |
| $a^*_{Rg}$ | −4 to 0 | −2 to −1 |
| $b^*_{Rg}$ | −13 to −6 | −12 to −8 |

This coated and tempered first substrate is characterized by a sufficiently high energy transmittance. In all cases, the energy transmittance of light of wavelength comprised between 300 and 2500 nm is higher than 0.68, preferably higher than 0.70, and more preferably higher than 0.72 and even more preferably higher than 0.74. The heat treatment that the first substrate is advantageously subjected to consists in heating the substrate to temperatures higher than 500°, or even higher than 600° for a time longer than 4 minutes, in a manner well known to those skilled in the art.

According to the two embodiments of the invention, the first substrate is laminated with a second substrate by means of at least one intermediate film of polymeric material that is inserted between the two substrates. One of the objectives of the invention is for the spandrel panel thus formed to meet certain esthetic criteria (see table 2 below). The second substrate of the laminated assembly of the invention is opaque. It may be organic or mineral in nature, or in a composite even organic and mineral in nature. Advantageously, the second substrate of the laminate of the invention is an opaque polymer, such as, for example, a polyvinyl fluoride, and in particular the polyvinyl fluoride sold by DuPont under the name "Tedlar". In another embodiment, the second substrate is a glass substrate that is made opaque, for example using a black paint, so as to form an assembly sold by the company AGC Glass Europe under the name "Lacobel black classic". In one alternative embodiment, the second substrate may also be composed of a plurality of (organic and mineral) elements that are successively deposited on the intermediate film of polymeric material. By way of illustration, according to one alternative embodiment, an opaque polymeric film (for example a black film of polyethylene terephthalate (PET)), a layer of ethylene-vinyl acetate (EVA) and lastly a pane of previously tempered float glass have thus been deposited, such as to obtain a laminate that may be represented as follows (said laminate is also schematically shown in FIGS. 7 and 8):

coated first substrate/intermediate film/black PET/EVA/ordinary glass

In each embodiment, the intermediate film of polymeric material is advantageously chosen from polyvinyl butyral (PVB), ethylene vinyl acetate (EVA), polyvinyl chloride (PVC), polyurethane (PU), ionomers or any other polymer having the required properties, such as, for example, thermoplastic polyolefins from Dow. The intermediate film of polymeric material has a thickness comprised between 0.3 and 2 mm. This intermediate film may be a superposition of a plurality of sheets of the same material or of different materials.

The two substrates are assembled using a method well known to those skilled in the art, and for example the method described in WO2003084744A1 or BE876681A. The first substrate is covered by the polymeric sheet, which is drawn from a roll, and said sheet is then cut to the dimensions of the first substrate before the second substrate is laid thereon. The assembly thus formed is calendered and autoclaved, after degassing. This assembling method is given by way of illustration, and any other method of assembling a laminate may be used to the ends of the invention.

The laminate obtained in accordance with any embodiment of the invention is characterized by the sought optical properties, such as collated in table 2. Thus, the targeted values are mainly related to the esthetic appearance in reflection exterior-side (exterior reflectance and color parameters in exterior reflection).

TABLE 2

|  | Preferred embodiment | More preferred embodiment |
| --- | --- | --- |
| $Y_{Rext}$ (%) | 10 to 20 | 12 to 18 |
| $a^*_{Rext}$ | −4 to 0 | −2 to −1 |
| $b^*_{Rext}$ | −13 to −6 | −12 to −7 |

Advantageously, as the first substrate has a high energy transmittance, it is possible to add photovoltaic cells between the first and second substrates of the laminate, and to take advantage of the intermediate sheet of polymeric material to secure them. In this case, after the first substrate has been covered with a first intermediate film of polymeric material, the photovoltaic cells are placed on this film, electrical connections are made to the cells, and the assembly thus formed is covered with a second film of polymeric material. Lastly, the second substrate is placed on the second film of polymeric material and the assembly thus formed is laminated using a method well known to those skilled in the art (see above). The second substrate may be of mineral nature (glass), of organic nature (Tedlar, etc.) or of composite nature (opaque film and glass).

In the case of the alternative embodiment in which the second substrate is made of clear glass, the laminated assembly may be represented as follows:

coated substrate 1/polymeric film/photovoltaic cells/polymeric film/black PET/EVA/substrate 2

Thus, in this particular embodiment the invention results in spandrel panels that have a particularly advantageous esthetic and that are equipped with photovoltaic cells that it is almost impossible to see. Thus, such spandrel panels form BIPV elements when used on facades and have the advantage of being esthetic and the merit of collecting solar energy.

Advantageously, the thickness of each intermediate polymeric film is comprised between 0.3 and 2 mm because the photovoltaic cells have a thickness comprised between 0.1 and 1.0 mm.

For esthetic reasons, it is known to mask the edges of the cells or at least to mask the electrical connections and any part likely to generate a discontinuity in the appearance of the finished product. One of the very big advantages of the invention is that, by virtue of the opaque second substrate, most parts of the cells remain impossible to see from the exterior and only a few particularly highly reflective connections must be hidden, for example using black polyvinyl fluoride or a coat of paint. The junction box, the role of which is to collect the electricity produced by the panel, may advantageously be located behind or beside the spandrel panel.

DETAILED DESCRIPTION OF THE INVENTION

The invention will now be described by means of figures and examples. It will however be noted that the examples are given merely by way of indication and in no way limit the invention.

Definitions

By spandrel panel, what is meant here is an opaque panel intended to be used on the facade of a building in areas between windows.

By opaque substrate, what is meant is that the light transmittance through the substrate is at most 4%, preferably at most 1% and even more preferably at most 0.5%.

By optical thickness, what is meant is the product of multiplying the geometric thickness of the material by its refractive index. By default and unless otherwise specified, it is a question of geometrical thickness.

Refractive index and extinction coefficient are concepts that are well known to those skilled in the art. In the present description and unless otherwise indicated, values of refractive index, of extinction coefficient and of optical thickness are given for a wavelength of 589 nm and were estimated by means of the optical simulation software package CODE-Theiss.

By way of indication, table 3 collates values of refractive index and of extinction coefficient for some dielectric materials. Unless otherwise specified, the values provided are simulated values, as indicated above. A value of zero for the extinction coefficient means that the simulated value was lower than 0.0001 For the mixed oxides or nitrides featuring in the table, the added ratios indicate the corresponding weight percentages of their components. For example, TZO 65/35 means a mixed oxide made up of 65 wt % titanium oxide and of 35 wt % zirconium oxide. These values will be used for the materials referred to in the rest of this text.

TABLE 3

| Dielectric compound | n (589 nm) | k (589 nm) |
| --- | --- | --- |
| $TiO_2$ | 2.47 | 0 |
| $ZrO2$ | 2.21* | 0* |
| $SiO2$ | 1.47 | 0.0018 |
| SiN | 2.03 | 0.0099 |
| ZrN | 3.2* | 0.5 |
| TZO 65/35 | 2.34 | 0.015 |
| TZO 75/25 | 2.34 | 0.0054 |
| TZO 50/50 | 2.29 | 0.0063 |
| ZSO5 52/48 | 2.02 | 0.0006 |
| SiZrN 68/32 | 2.21 | 0.015 |

*Wood and Nassau, Applied Optics, vol. 21, issue 16, pp. 2978-2981 (1982)

Figures

FIG. 1 illustrates in cross section the first substrate (S1) of the laminate of the invention, said substrate being intended for the first embodiment. The first substrate has two main faces (1) and (2). A top dielectric layer L, in accordance with the invention, is deposited on face (2) by PVD or PECVD.

Figure 2:
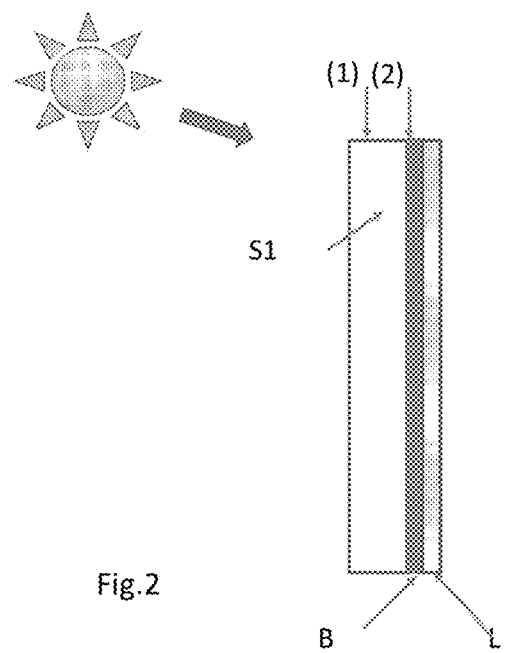
FIG. 2. Cross section of a first substrate intended for the second embodiment.

FIG. 2 illustrates in cross section the first substrate (S1) of the laminate of the invention, said substrate being intended for the second embodiment. The first substrate has two main faces (1) and (2). A first underlayer B is deposited on face (2) and then a top dielectric layer L, in accordance with the invention, is deposited on the underlayer B. Both layers are deposited by PVD or PECVD.

Figure 3:
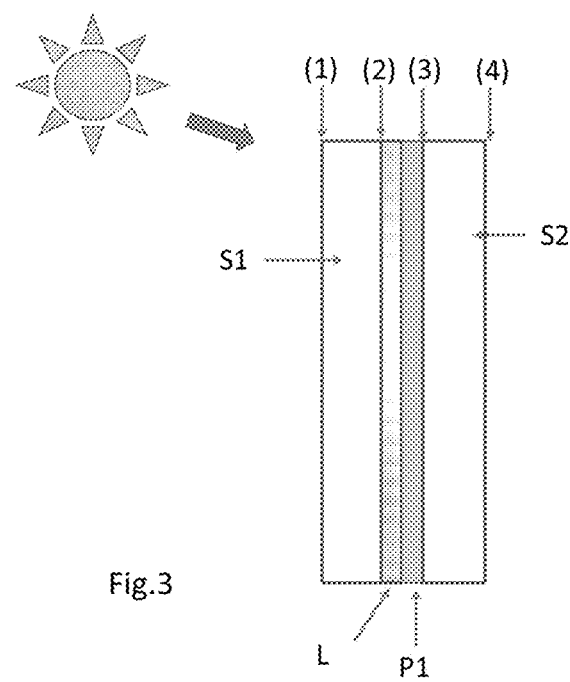
FIG. 3. Cross section of a laminate according to the first embodiment of the invention.

FIG. 3 illustrates in cross section the laminate according to the first embodiment of the invention. The first substrate (shown in FIG. 1) is laminated with the second substrate (S2) by means of an intermediate sheet (P1) of polymeric material that is deposited on the side of face (2) of the first substrate, which face is the face coated with the top dielectric layer (L).

Figure 4:
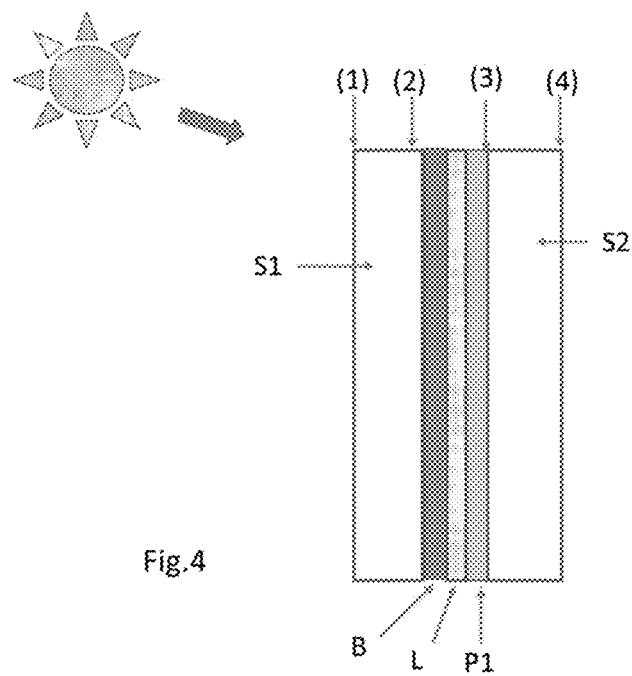
FIG. 4. Cross section of a laminate according to the second embodiment of the invention.

FIG. 4 illustrates in cross section the laminate according to the second embodiment of the invention. The first substrate (shown in FIG. 2) is laminated with the second substrate (S2) by means of an intermediate sheet (P1) of polymeric material that is deposited on the side of face (2) of the first substrate, which face is the face coated with the underlayer (B) and with the top dielectric layer (L).

Figure 5:
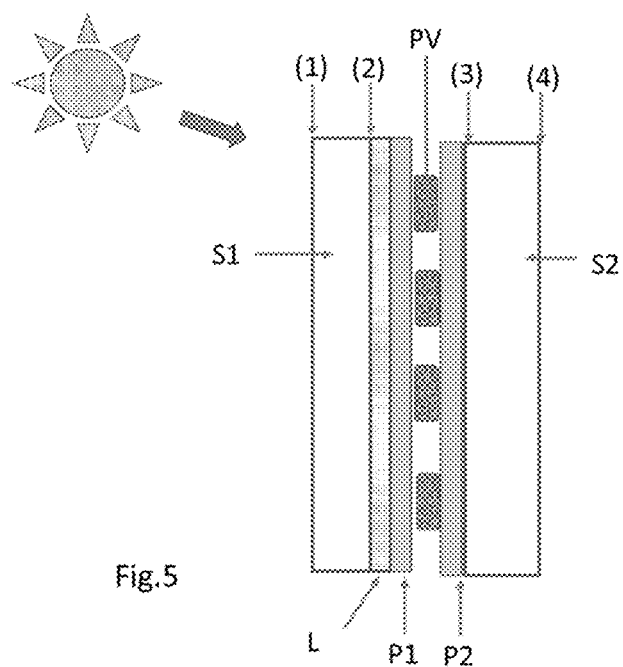
FIG. 5. Cross section of one particular embodiment of the invention with photovoltaic cells according to the first embodiment.

FIG. 5 illustrates in cross section the particular embodiment of the invention in which a second intermediate sheet (P2) of polymeric material is added to the laminate illustrated in FIG. 3 and photovoltaic cells (PV) are placed between the two intermediate sheets (P1) and (P2).

Figure 6:
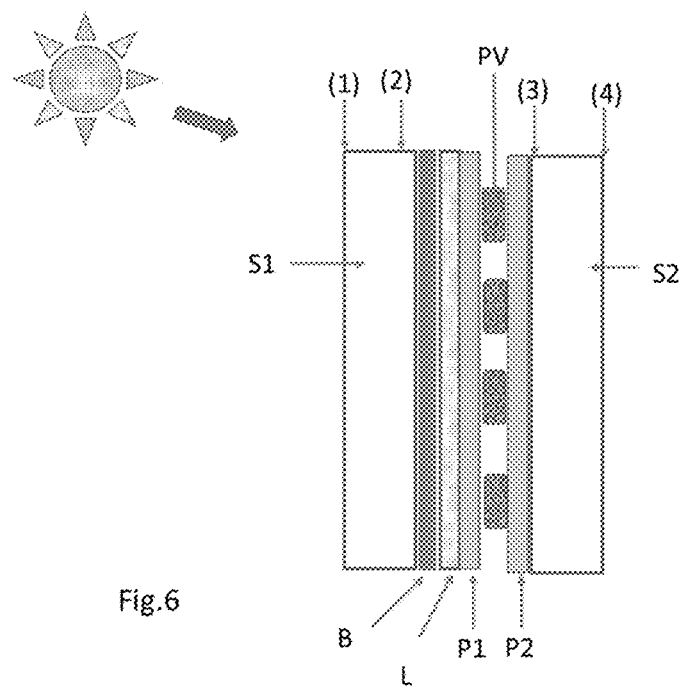
FIG. 6. Cross section of one particular embodiment of the invention with photovoltaic cells according to the second embodiment.

FIG. 6 illustrates in cross section the particular embodiment of the invention in which a second intermediate sheet (P2) of polymeric material is added to the laminate illustrated in FIG. 4 and photovoltaic cells (PV) are placed between the two intermediate sheets (P1) and (P2).

Figure 7:
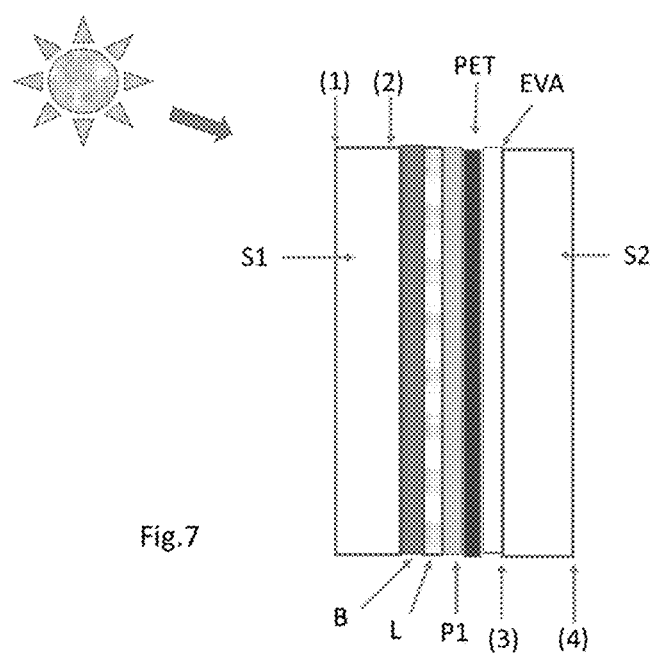
FIG. 7. Cross section of a laminate according to an alternative embodiment of the invention, in which embodiment the second substrate is a normal pane of glass made opaque by a black film of PET.

FIG. 7 illustrates in cross section the alternative embodiment in which the second substrate is an ordinary pane of glass made opaque by a black polymeric film made of PET, the adhesion of which to the glass of which is ensured by a film made of EVA. The alternative embodiment shown in FIG. 7 illustrates the second embodiment, in which an underlayer (B) is placed below the top dielectric layer (L).

Figure 8:
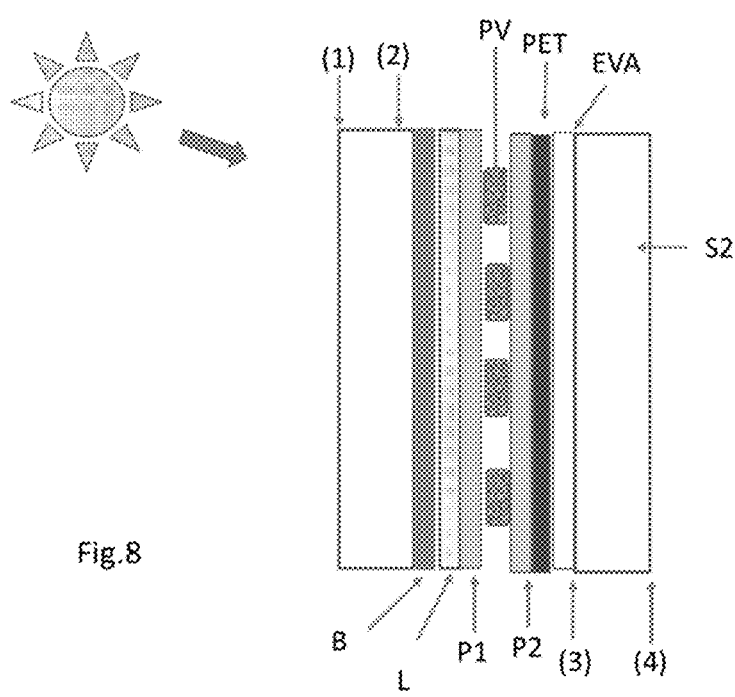
FIG. 8. Cross section of one particular embodiment of the invention with photovoltaic cells according to the alternative embodiment shown in FIG. 7.

FIG. 8 illustrates in cross section the particular embodiment of the invention in which a second intermediate sheet (P2) of polymeric material is added to the laminate illustrated in FIG. 7 and photovoltaic cells (PV) are placed between the two intermediate sheets (P1) and (P2).

EXAMPLES

According to the first embodiment, a top dielectric layer of the invention is deposited on the first substrate. Table 4 shows the optical parameters obtained by virtue of a simulation carried out by means of the Theiss CODE system for top dielectric layers made of various types of dielectrics. In these examples, the dielectrics have a geometric thickness of 27 nm and are deposited on 3.85 mm thick clear glass of the type marketed by AGC under the name Clearlite. The simulated values are given for a monolithic substrate. Energy transmittance was simulated on the basis of a calculation according to standard EN 410 (2011) for a wavelength range comprised between 390 and 2500 nm.

TABLE 4

| Dielectric layer | Optical parameters in exterior reflection | | | | Energy transmittance |
|---|---|---|---|---|---|
| | $Y_{Rg}$ | $L_{Rg}^*$ | $a_{Rg}^*$ | $b_{Rg}^*$ | |
| TiO$_2$ | 25.21 | 57.68 | −2.1 | −11.78 | 0.7353 |
| ZSO 52/48 | 13.87 | 44.27 | −1.17 | −6.54 | 0.815 |
| SiN | 13.72 | 44.03 | −1.3 | −5.77 | 0.8126 |
| TZO 50/50 | 19.74 | 51.89 | −1.89 | −9.82 | 0.7697 |
| TZO 65/35 | 21.51 | 53.86 | −1.99 | −10.35 | 0.7633 |
| TZO 75/25 | 21.37 | 53.72 | −1.94 | −10.69 | 0.7598 |
| SiZrN 60/40 | 17.62 | 49.34 | −1.61 | −8.89 | 0.7797 |

Still according to the first embodiment, glazings having TZO 65/35 as the dielectric layer deposited on the first substrate (3.85 mm float glass) were simulated. Table 5 gives the optical parameters obtained for various thicknesses of TZO 65/35. The thicknesses are geometric thicknesses and are given in nm. The values were obtained through a simulation carried out using the Theiss CODE system. The simulated values are given for a monolithic substrate. Energy transmittance was simulated on the basis of a calculation according to standard EN 410 (2011) for a wavelength range comprised between 390 and 2500 nm.

TABLE 5

| Dielectric layer | Geometric thickness (nm) | Optical parameters in exterior reflection | | | | Energy transmittance |
|---|---|---|---|---|---|---|
| | | $Y_{Rg}$ | $L_{Rg}^*$ | $a_{Rg}^*$ | $b_{Rg}^*$ | |
| TZO 65/35 | 7 | 9.3 | 36.66 | −0.45 | −3.28 | 0.8512 |
| TZO 65/35 | 12 | 11.56 | 40.71 | −0.69 | −6.51 | 0.8343 |
| TZO 65/35 | 17 | 14.59 | 45.36 | −1.08 | −8.91 | 0.8121 |
| TZO 65/35 | 22 | 18.02 | 49.87 | −1.54 | −10.14 | 0.7877 |
| TZO 65/35 | 27 | 21.51 | 53.86 | −1.99 | −10.35 | 0.7633 |
| TZO 65/35 | 32 | 24.79 | 57.22 | −2.38 | −9.79 | 0.7405 |
| TZO 65/35 | 37 | 27.67 | 59.89 | −2.68 | −8.66 | 0.7204 |
| TZO 65/35 | 42 | 30.1 | 61.93 | −2.9 | −7.06 | 0.7037 |
| TZO 65/35 | 47 | 31.76 | 63.34 | −3.06 | −5.03 | 0.691 |

Examples 1 to 4 of Realization of the Invention According to the First Embodiment A 4 mm thick extra-clear glass panel was introduced into a vacuum chamber of a magnetron cathode-sputtering apparatus. The vacuum chamber was equipped with a ceramic cathode made of titanium-zirconium oxide (65/35). Using a method well known to those skilled in the art, a layer of TZO 65/35 was deposited on the glass substrate in an atmosphere of oxygen and argon. The conditions were adjusted so as to obtain the 4 coated examples described in Table 6, which examples differ in the thickness of the deposited layer.

TABLE 6

| Ex | Geometric thickness (nm) | Monolithic light transmittance after tempering | | | | Reflectance and color parameters glass-side | | | | Reflectance and color parameters film-side | | | |
|---|---|---|---|---|---|---|---|---|---|---|---|---|---|
| | | Y | $L_{Tv}^*$ | $a_{Tv}^*$ | $b_{Tv}^*$ | $Y_{Rg}$ | $L_{Rg}^*$ | $a_{Rg}^*$ | $b_{Rg}^*$ | $Y_{Rc}$ | $L_{Rc}^*$ | $a_{Rc}^*$ | $b_{Rc}^*$ |
| 1 | 28 | 75.52 | 89.48 | −0.05 | 5.61 | 22.11 | 54.49 | −2.05 | −9.98 | 22.74 | 55.15 | −1.55 | −10.38 |
| 2 | 27 | 76.38 | 89.88 | −0.1 | 5.51 | 21.42 | 53.76 | −1.96 | −10.12 | 21.97 | 54.35 | −1.48 | −10.53 |

TABLE 6-continued

| | Geometric thickness | Monolithic light transmittance after tempering | | | | Reflectance and color parameters glass-side | | | | Reflectance and color parameters film-side | | | |
|---|---|---|---|---|---|---|---|---|---|---|---|---|---|
| Ex | (nm) | Y | $L_{Tv}^*$ | $a_{Tv}^*$ | $b_{Tv}^*$ | $Y_{Rg}$ | $L_{Rg}^*$ | $a_{Rg}^*$ | $b_{Rg}^*$ | $Y_{Rc}$ | $L_{Rc}^*$ | $a_{Rc}^*$ | $b_{Rc}^*$ |
| 3 | 30 | 74.1 | 88.81 | 0.06 | 5.63 | 23.53 | 55.95 | −2.2 | −9.53 | 24.11 | 56.53 | −1.66 | −9.89 |
| 4 | 34 | 71.13 | 87.38 | 0.27 | 5.59 | 25.73 | 58.09 | −2.45 | −8.72 | 26.33 | 58.67 | −1.86 | −9.12 |

The samples were heat treated (held at 670° C. for 4 minutes). In each case, all of the optical parameters (Y, L*, a*, b*) in reflection or in transmission, measured before and after the heat treatment, remained stable.

A number of samples were laminated with a Tedlar substrate by means of an EVA polymer film and in such a way as to incorporate photovoltaic cells. The optical parameters of the laminated assembly were measured by means of an Ultrascan spectrophotometer and are given in table 7. The color parameters are given for reflection exterior-side, i.e. from the uncoated side of the glass substrate of the laminate.

TABLE 7

| References | TZO (nm) Geometric thicknesses | $Y_{Rext}$ | $L_{Rext}^*$ | $a_{Rext}^*$ | $b_{Rext}^*$ |
|---|---|---|---|---|---|
| 5 | 24 | 12.7 | 42.6 | −1.11 | −9.37 |
| 6 | 22 | 11.6 | 40.9 | −0.89 | −9.48 |
| 7 | 27 | 13.7 | 44.2 | −1.25 | −9.98 |

The presence of the opaque second substrate and the obtained advantageous reflectance are responsible for optical disappearance of everything behind the first substrate. Because of its particularly attractive esthetic appearance, it is therefore possible to use the laminate as a spandrel panel.

Examples 8 to 9 of Realization of the Invention According to the Second Embodiment In the second embodiment of the invention, a barrier layer is deposited on the first substrate before deposition of the dielectric layer of the invention. A 4 mm thick extra-clear glass panel was introduced into a first vacuum chamber of a magnetron coating apparatus. The vacuum chamber was equipped with a zinc-tin alloy cathode (52% Zn). Using a method well known to those skilled in the art, a layer of ZSO5 was deposited on the glass substrate in an atmosphere of oxygen and argon. The substrate was then transferred to a second vacuum chamber equipped with a cathode made of titanium-zirconium oxide (65/35). Using a method well known to those skilled in the art, a layer of TZO 65/35 was deposited on the first barrier layer in an atmosphere of oxygen and argon. The samples obtained were heat treated (maintained at 670° C. for 4 minutes).

Table 8 collates the optical parameters measured on the coated first substrate according to the second embodiment of the invention. The optical parameters are those in exterior reflection, i.e. in reflection from the glass side of the first monolithic substrate, after tempering. The energy transmittance was measured according to standard EN 410 (2011) for a wavelength range comprised between 290 and 2500 nm.

TABLE 8

| | Geometric thicknesses (nm) | | Optical parameters in glass-side reflection | | | | Energy transmittance |
|---|---|---|---|---|---|---|---|
| References | ZSO5 | TZO | $Y_{Rg}$ | $L_{Rg}^*$ | $a_{Rg}^*$ | $b_{Rg}^*$ | (TE) |
| 8 | 25.1 | 22.3 | 22.64 | 54.92 | −2.23 | −6.23 | 0.738 |
| 9 | 15 | 23 | 20.46 | 52.35 | −2.03 | −8.15 | 0.761 |
| 10 | 10.1 | 25.3 | 22.61 | 54.98 | −1.94 | −8.98 | 0.7491 |
| 11 | 8.7 | 25.8 | 22.9 | 55.29 | −1.95 | −9.08 | 0.7458 |
| 12 | 13.1 | 29 | 25.43 | 57.77 | −2.22 | −8.04 | 0.7277 |
| 13 | 9.1 | 18.5 | 17.72 | 49.45 | −1.39 | −8.78 | 0.7835 |

The examples shown above were then laminated with a second Tedlar substrate by means of EVA. Photovoltaic cells were inserted into the EVA. Certain optical parameters of the laminated assembly were then measured using an Ultrascan spectrophotometer. The measured values related to exterior reflection, i.e. reflection from the glass side of the first substrate, and are given in table 9.

TABLE 9

| | Geometric thicknesses (nm) | | Optical parameters of the laminate in exterior reflection | | | |
|---|---|---|---|---|---|---|
| Reference | ZSO5 | TZO | $Y_{Rext}$ | $L_{Rext}^*$ | $a_{Rext}^*$ | $b_{Rext}^*$ |
| 14 | 25.1 | 22.3 | 12.94 | 42.88 | −1.58 | −6.03 |
| 15 | 15 | 23 | 11.45 | 40.59 | −1.16 | −7.69 |
| 16 | 10.1 | 25.3 | 13.79 | 44.24 | −1.52 | −8.77 |
| 17 | 8.7 | 25.8 | 13.82 | 44.28 | −1.55 | −8.91 |
| 18 | 13.1 | 29 | 15.26 | 46.27 | −1.84 | −8.06 |
| 19 | 9.1 | 18.5 | 10.14 | 38.36 | −0.94 | −8.02 |

Insertion of Photovoltaic Cells into the Laminate of the Invention

In one advantageous embodiment, after EVA had been deposited on the first substrate (coated glass, corresponding to reference 5), photovoltaic cells were arranged in place, a second EVA film was deposited and lastly the opaque second substrate was positioned in place. The efficiency of this laminate thus formed and equipped with photovoltaic cells was evaluated under standard test conditions (STC), this requiring the cell, maintained at a temperature of 25° C., to be irradiated with a power of 1000 watts per square meter with an air mass 1.5 spectrum (standard EN 50380, 2003). It has thus been shown that when the photovoltaic cell received light through the first substrate bearing its layers, efficiency was reduced by at most 20%, preferably by at most 15% and even more preferably by at most 10% with respect to measurement through uncoated glass. Efficiency was calculated by measuring the kilowatt-peak of the cell (watt-peak), which is well known to those skilled in the art, and which allows performance of photovoltaic panels to be evaluated with a view to predicting the amount of electricity that they will be able to produce under optimal conditions.

The invention claimed is:

1. A spandrel panel comprising:
a first substrate having a coating consisting of one or two dielectric layers,
an intermediate film of polymeric material, and
an opaque second substrate,
wherein the coating comprises a top dielectric layer deposited on a surface of the first substrate located on a side facing the intermediate film of polymeric material, and
wherein the coated first substrate has an energy transmittance higher than 0.68 for light having a wavelength between 300 and 2500 nm.

2. The spandrel panel according to claim 1, wherein the top dielectric layer has a refractive index at least equal to 2.0, and an absorption coefficient lower than 0.1.

3. The spandrel panel according to claim 1, wherein the top dielectric layer is an oxide layer, a nitride layer or an oxynitride layer, comprising at least two different elements selected from the group consisting of silicon, titanium, zinc, tin, zirconium, aluminium, and niobium.

4. The spandrel panel according to claim 1, wherein the top dielectric layer is a mixed titanium-zirconium oxide or a mixed silicon-zirconium nitride.

5. The spandrel panel according to claim 1, wherein the top dielectric layer has an optical thickness at least equal to 40 nm, and of at most 110 nm.

6. The spandrel panel according to claim 1, wherein an underlayer is deposited on the first substrate between the first substrate and the top dielectric layer.

7. The spandrel panel according to claim 6, wherein the underlayer is an oxide layer, a nitride layer or an oxynitride layer comprising at least two different elements selected from the group consisting of silicon, titanium, zinc, tin, zirconium, aluminium, and niobium.

8. The spandrel panel according to claim 6, wherein the underlayer is a mixed zinc-tin oxide.

9. The spandrel panel according to claim 6, wherein the geometric thickness of the underlayer is at least equal to 5 nm, and smaller than or equal to 30 nm.

10. The spandrel panel according to claim 1, wherein the first substrate has an energy transmittance of light of wavelength between 300 and 2500 nm that is higher than 0.70.

11. The spandrel panel according to claim 1, wherein the spandrel panel has a reflectance measured on an exterior side between 10 and 20%.

12. The spandrel panel according to claim 1, wherein the spandrel panel has a color in exterior reflection of parameter a* between −4 and 0, and a parameter b* between −13 and −6.

13. The spandrel panel according to claim 1, wherein the second substrate is an ordinary glass made opaque by means of a polymeric film or an opaque synthetic substrate.

14. The spandrel panel according to claim 1, wherein the intermediate film of polymeric material has a thickness between 0.3 and 2 mm and is selected from the group consisting of polyvinyl butyral (PVB), ethylene vinyl acetate (EVA), polyvinyl chloride (PVC), polyurethane (PU), and ionomers.

15. The spandrel panel according to claim 1, wherein photovoltaic cells are inserted between the first substrate and the second substrate.

16. The spandrel panel according to claim 15, wherein the spandrel panel has a photovoltaic efficiency which is decreased by at most 20% with respect to a uncoated glass under standard test conditions (STC).

17. The spandrel panel according to claim 1, wherein the top dielectric layer has an optical thickness at least equal to 50 nm, and of at most 80 nm.

18. The spandrel panel according to claim 6, wherein a geometric thickness of the underlayer is at least equal to 6 nm, and smaller than or equal to 25 nm.

19. The spandrel panel according to claim 1, wherein the first substrate has an energy transmittance of light of wavelength between 300 and 2500 nm that is higher than 0.74.

20. The spandrel panel according to claim 1, wherein the first and second substrates are glass substrates.

21. A spandrel panel comprising:

a first substrate having a coating consisting of one or two dielectric layers, an intermediate film of polymeric material, and an opaque second substrate, wherein the coating comprises a top dielectric layer deposited on a surface of the first substrate located on a side facing the intermediate film of polymeric material, wherein the coated first substrate has an energy transmittance higher than 0.68 for light having a wavelength between 300 and 2500 nm, and wherein the top dielectric layer has a refractive index at least equal to 2.1, and an absorption coefficient lower than 0.05.

22. The spandrel panel according to claim 21, wherein photovoltaic cells are inserted between the first substrate and the second substrate.

* * * * *